US007520368B2

(12) United States Patent
Moore

(10) Patent No.: US 7,520,368 B2
(45) Date of Patent: Apr. 21, 2009

(54) HORIZONTALLY FOLDED REFLEX-PORTED BASS HORN ENCLOSURE

(76) Inventor: Dana A. Moore, 25-157th Pl SE., Bothell, WA (US) 98012

( * ) Notice: Subject to any disclaimer, the term of this patent is extended or adjusted under 35 U.S.C. 154(b) by 114 days.

(21) Appl. No.: 11/811,152

(22) Filed: Jun. 8, 2007

(65) Prior Publication Data

US 2008/0302595 A1 Dec. 11, 2008

(51) Int. Cl.

*G10K 11/02* (2006.01)
*G10K 11/20* (2006.01)
*H04R 1/22* (2006.01)
*H04R 1/30* (2006.01)
*H05K 5/02* (2006.01)
*H04R 1/20* (2006.01)

(52) U.S. Cl. ....................... 181/155; 181/156; 181/152; 181/192; 381/341; 381/352

(58) Field of Classification Search ................. 181/199, 181/156, 177, 152, 148, 155, 194, 192, 187, 181/188; 381/341, 352, 160, 349, 338, 340, 381/345, 337, 339, 342

See application file for complete search history.

(56) References Cited

U.S. PATENT DOCUMENTS 1,843,524 A * 2/1932 Stenger ...................... 181/159
2,310,243 A * 2/1943 Klipsch ...................... 181/152
2,373,692 A * 4/1945 Klipsch ...................... 181/152
2,491,982 A * 12/1949 Kincart ...................... 181/156
2,558,278 A * 6/1951 Stone et al. ................. 181/194
2,646,851 A * 7/1953 Chapman et al. ............ 181/155
2,746,558 A * 5/1956 Levy .......................... 181/194
2,815,086 A * 12/1957 Hartsfield ................... 428/102
2,858,899 A * 11/1958 Lopez-Henriquez ........ 181/155
3,032,137 A * 5/1962 Rice ........................... 181/199
3,912,866 A * 10/1975 Fox ............................ 381/352
3,941,207 A * 3/1976 Croup ........................ 181/199
4,014,597 A * 3/1977 Griffin, Jr. .................. 312/7.1
4,173,266 A * 11/1979 Pizer et al. .................. 181/156
4,200,170 A * 4/1980 Williams, Jr. ............... 181/155
4,210,223 A * 7/1980 Gillum et al. ............... 181/152
4,286,688 A * 9/1981 O'Malley ................... 181/156
4,356,881 A * 11/1982 Lowell ....................... 181/150
4,509,192 A * 4/1985 Straughn .................... 381/348
4,860,367 A * 8/1989 Hook ......................... 381/341
5,189,706 A * 2/1993 Saeki ......................... 381/349
5,266,752 A * 11/1993 Cussans ...................... 181/155
5,321,388 A * 6/1994 Biersach .................. 340/404.1
5,327,985 A * 7/1994 Porzilli ....................... 181/177
5,359,158 A * 10/1994 Queen ........................ 181/150
5,468,922 A * 11/1995 Hanba ........................ 181/150
5,525,767 A * 6/1996 Fields ........................ 181/155
5,637,840 A * 6/1997 Kim ........................... 181/152
5,804,774 A * 9/1998 Ford et al. .................. 181/152
6,144,751 A * 11/2000 Velandia ..................... 381/345
6,634,455 B1 * 10/2003 Yang .......................... 181/156

(Continued)

*Primary Examiner*—Edgardo San Martin

(57) ABSTRACT

A low frequency folded horn enclosure intended for use in proximity with at least one planar surface with access to the horn throat from the top of the enclosure. The horn is bifurcated at the throat and folds horizontally around a central trapezoid-shaped columnar back chamber which includes a phase-inverting means. The throat channel expands vertically to the single fold and expands vertically and horizontally to the horn mouth, maximizing back chamber volume within the constraints imposed by footprint size, frequency response, and driver characteristics.

9 Claims, 1 Drawing Sheet

U.S. PATENT DOCUMENTS 7,233,677 B2 * 6/2007 Moore ........................ 381/341
7,252,176 B2 * 8/2007 Moore ........................ 181/199
7,436,972 B2 * 10/2008 Bouvier ...................... 381/345
2008/0099273 A1 * 5/2008 Moore ........................ 181/156
2008/0110692 A1 * 5/2008 Moore ........................ 181/156

* cited by examiner

HORIZONTALLY FOLDED REFLEX-PORTED BASS HORN ENCLOSURE

BACKGROUND OF THE INVENTION

The present invention relates to loudspeaker enclosures of the low frequency exponential folded horn type. More specifically, it relates to front-loaded horn enclosures that are reflex-ported and are intended for use in close proximity to at least one planar surface, such as a floor, ceiling or wall.

The current invention relates directly to my previous U.S. patent application Ser. No. 11/107,453 and can be considered a contribution over my previous invention with regard to improved low frequency performance by increasing the available back chamber volume with minimal changes to the overall dimensions of the previous invention, and an improvement in comparatively reducing construction costs.

The current invention provides improved economic benefits by simplifying the construction process compared to the previous invention by increasing the number of parts employed which would seem counter-intuitive, however, the parts in question are relatively simple to manufacture, and provide for simplified construction methods, thereby resulting in less time and effort being required.

The current invention is designed around a specific 15-inch purpose-built driver which provides the opportunity to utilize a relatively small horn throat cross-section as required for the maximum mid-band efficiency of the driver and to further optimize the low frequency performance specific to the driver. The requirements of the particular driver and the constraints imposed on the current invention are defined as follows:

a) Maximum Throat Cross-Sectional Area (St)=58.5 square inches b) Port Tuning below the Low Frequency Cutoff (Fc) of the horn (approximately 70 Hz)

c) Driver capable of resonant behavior in approximately 4 cubic feet of back chamber volume (Vb) to capacitate the port d) Enclosure footprint size to remain within +/−1 inch in width or length of the previously cited prior art; vertical height remains unchanged The current invention substantially maintains the overall footprint of the previous invention, and the overall cabinet dimensions remain very close to the previous design, in the present disclosure, within an inch of the dimensions of the previous invention. Increases to the throat cross-sectional area (St) would impact on the overall enclosure size unless the back chamber volume (Vb) is made smaller to compensate. The balance of the two is determined by the performance characteristics of the driver selected, and the otherwise arbitrary size limitations imposed on the enclosure. In the current invention, the overall size of the enclosure is limited to within +1 inch of the previous invention in any dimension. The overall size of the previously cited prior art was deemed suitably compact considering its response capabilities and provides the size constraints imposed on the current invention.

The current invention, while specific to a particular driver, is more economical to build and increases the potential low frequency performance capabilities afforded by the available increased back chamber volume compared to the previously cited prior art invention.

SUMMARY OF THE INVENTION

It is an object of the present invention to provide at least the same levels of performance and efficiency as in the previously cited invention while increasing the ease of construction.

An additional object of the present invention is to provide, in as much as is possible, a comparable footprint size when compared to the previously cited prior art example.

It is a further object of the present invention to provide an increased low frequency response by the incorporation of additional void space compared to the previously cited example.

The present invention horn mouth area is consistent with the previous invention as approximately 4 square feet in area. The frequency response and efficiency rating also remains relatively consistent with the previous invention. The overall enclosure volume and footprint dimensions are relatively consistent with the previous invention within +/−1 inch. The enclosure height remains the same as the previous invention. The current invention footprint is rectangular in shape, which differs from the previous invention, and provides easier construction.

The current invention allows for a larger back chamber volume than the previously cited prior art in approximately the same overall enclosure volume, allowing for a lower resonance and reflex-port tuning to be achieved, within the limitations of the driver employed.

The nominal Fc of approximately 70 Hz and the overall length of the bass horn remains the same as the previous invention, as does the overall horn mouth cross-section. The throat expansion is achieved through the use of vertically expanding baffles and channel height-limiting horizontal baffles which provide a consistent channel depth to the throat channel pathway. The throat channel horn section employs the same proportional depth to the channel as ½ of the throat opening cross-sectional area (St). The baffles are arranged to exclusively expand vertically in the throat section. The terminal horn section additionally expands horizontally as well as vertically. The throat channel expansion proportions and the addition of vertical side channel baffles with the attendant increase in available back chamber volume constitute the main difference between the current invention and the previously cited invention. The throat baffle arrangement of the current invention utilizes a single flat enclosure back panel is comparatively easier to manufacture and construct than the previously cited prior art throat assembly which utilizes a V-angled two-panel back.

The current invention back chamber shape and proportions remain unchanged from the previous invention, however, the additional void areas introduced by the additional vertical baffles serve to increase the available void space which is added to the back chamber volume. The increased back chamber volume allows for lower resonance and facilitates lower port tuning as desired, along with lessening or eliminating the need for additional absorptive material to be added to the back chamber. The current invention maximizes the available back chamber volume for the given folded horn enclosure volume.

DESCRIPTION OF THE INVENTION

Figure 1:
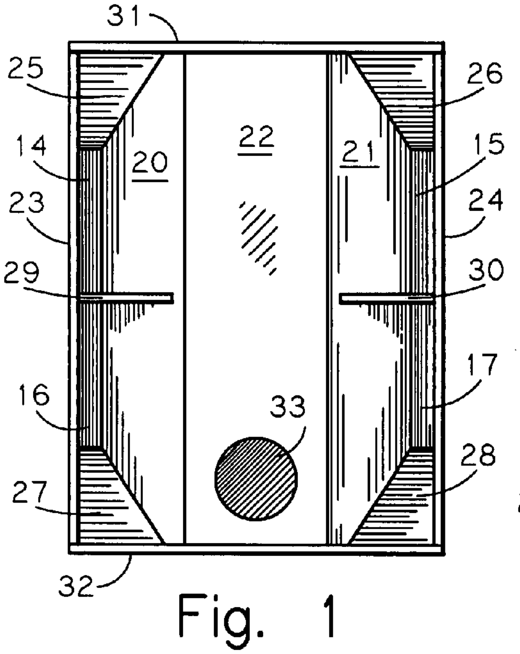
FIG. 1 is a frontal elevation view of the invention.

Referring to FIG. 1, the present invention embodiment is disclosed as seen from the front, where the overall horn mouth cross-sectional area is approximately 4 square feet. The ducted reflex-port 33 contains an equivalent volume of approximately one-half of the overall mouth area. The selected port volume can be altered to accomplish frequency tuning based on the requirements of the application and respective horn driver employed. It is desirable to tune the port to achieve a response of approximately 50 Hz to 32 Hz.

Figure 2:
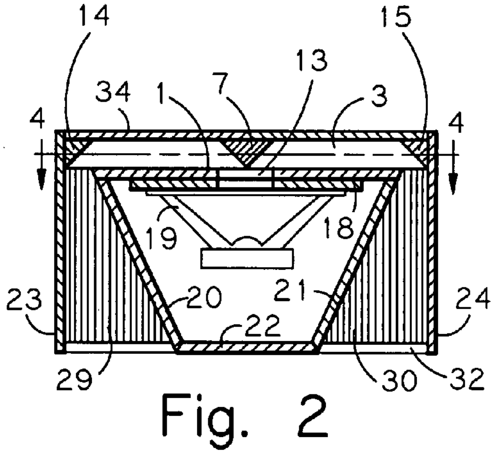
FIG. 2 is a sectional view from line 2-2 of FIG. 3.

Referring to FIG. 2, the present invention contains a trapezoidal back chamber formed from parts 1, 20, 21, 22 which create a vertically oriented column which is sealed against air leaks except for the top panel 31 access cutout and throat cavity opening 13. The throat cavity opening 13 exists on the back-facing baffle 1 portion of the back chamber and is configured to accept and mount a driver mounting board 18 to the baffle throat cavity opening 13 in a manner common in the present art. The corner reflectors 14, 15, 16, 17 provide an attachment substrate and are intended to turn the waveforms through the folds of the horn channels with a minimum of turbulence.

The volume of the back chamber, not including the displacement of the respective driver, is approximately 4.25 cubic feet to lower the resonant frequency of the back chamber for use by the porting mechanism. The use of sound absorptive material can be used to increase the virtual volume of the back chamber by as much as 25 percent. The additional void spaces available by the side channel vertical baffles 25, 26, 27, 28 on the side (terminal) horn channels affords an overall Vb of over 5 cubic feet to be easily achieved. The side channel vertical baffles 25, 26, 27, 28 can best be viewed in FIG. 1 and FIG. 3.

Figure 4:
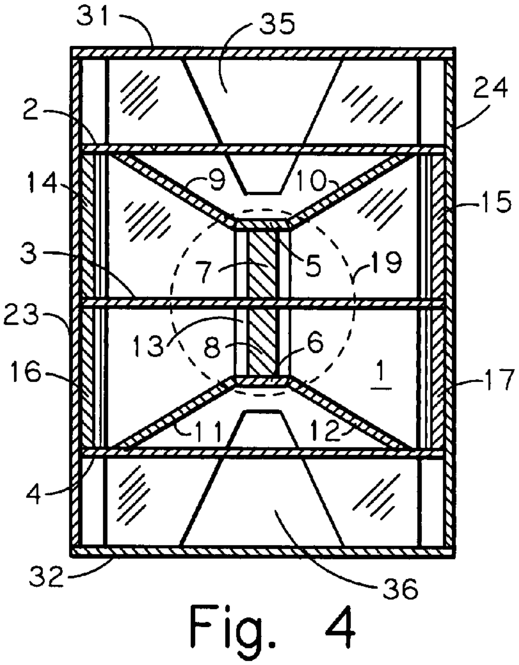
FIG. 4 is a sectional view of the invention from line 4-4 of FIGS. 2 and 3 showing the throat cavity opening and the orientation of the driver as a reference.

Referring to FIG. 4, via the baffle cutouts 35, 36, the triangular spaces formed by the baffle panel 1 and the throat channel baffle pieces 5, 6, 9, 10, 11, 12 and the rear panel 34 are made part of the total volume of the back chamber and are filled with absorptive material, by which the maximum of over 5 cubic foot volume is attained. Additional absorptive material can be added to the back chamber and/or other void spaces to further increase the compliance of the back chamber to meet specific applications as needed. It is possible to add or subtract the amount of absorptive material at any time by reaching through the baffle cutouts 35, 36.

Referring to FIG. 4, the throat cavity opening 13 is sized at 58.5 square inches, intended for the use of a single 15-inch diameter driver 19. The vertically oriented horn throat cavity opening 13 is bifurcated via the throat splitting wedges 7, 8 which are intended to turn the waveform 90 degrees into the horizontal exponential channels formed by the throat exponential baffle parts 9, 10, 11, 12 and horizontal braces 2, 3, 4, 5, 6 with the least turbulence possible. The throat splitting wedges 7, 8 also provide an attachment substrate for the rear panel 34 as does the horizontal braces 2, 3, 4, 5, 6 and the throat exponential baffles 9, 10, 11, 12. The inclusion of the central horizontal brace 3 is optional, and if left out, presumably the splitting wedge would be made one piece instead of the two separate ones described herein. Many throat configurations are possible which perform the same task, that is, forming an air-tight throat channel of the appropriate dimensions, and therefore should not be limited to only that as defined in the drawings.

Figure 3:
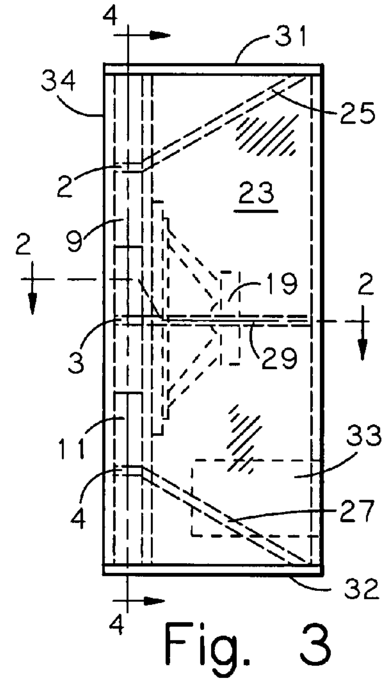
FIG. 3 is a side elevation view showing the orientation of the driver and reflex-ports as a reference.

The throat exponential baffles 9, 10, 11, 12 and the horizontal braces 2, 4 are arranged in such a manner that in concert with the rear cover panel 34 as seen in FIGS. 2 and 3, the proper cross-sectional area for the expansion rate of 60 Hz, or an exponential expansion area doubling length of 12 inches, is maintained. The horizontal throat channel braces 2, 4 provide the upper and lower vertical expansion limits for the throat channel sections as seen in FIGS. 3 and 4.

Referring to FIG. 1, the top 31 and bottom 32 panels provide the vertical limits to the horn mouth. The side channel vertical baffles 25, 26, 27, 28 expand from the terminus of the throat channel section to substantially the height of the horn mouth. In the present disclosure, this is approximately 33-inches in height. The top panel 31 also features a cutout opening (not shown in the drawings), which provides access to the back chamber, as with the previously cited prior art.

Referring to FIG. 2, the terminal horn channels are formed by the outer sides of the back chamber 20, 21 and the inner sides of the outer side panels 23, 24. The horizontal side channel central braces 29, 30 are for suppressing vibration in the side panels and provide an attachment substrate for the side panels 23, 24. All of the horn channels in the cabinet are sealed against air leaks.

The terminal channel expansion rate is approximately 125 Hz Fc after the fold, or an exponential doubling length of approximately 5.5 inches. The combination of the 60 Hz exponential throat horn section and the 125 Hz Fc terminal horn section result in an overall Fc of approximately 70 Hz.

The horn mouth occurs at the point of horizontal travel where the enclosure physically ends and the horn itself begins to unload. The overall length of the horn pathway is approximately 26 inches, measured center of channel. The present invention is disclosed as being made of panels of ¾ inch thickness, with the resultant footprint being 25⅞ inches wide by 17-inches in depth.

The driver mounting board 18 can optionally be used as an acoustic filter when sized smaller than the throat cavity opening 13. The size of the filter cutout to be used is determined by the driver being employed and efficiency and frequency band pass desired.

Wherein this disclosure depicts one specific type of manufacture, it should not be limited to materials and processes that utilize only straight planar elements, such as plywood and the like. It should also be noted that while straight lines have been used for describing the various horn channels and the splitting wedges, an alternative and perhaps better embodiment could utilize curved or concave elements which would promote an even rotational angle or approximate a true exponential curve more closely. It should be also be noted that while a ducted port is disclosed in the drawings, the porting mechanism should not be limited to the use of ducted ports only; other methods of reflex-porting could also be employed, including other phase inverting methodologies, such as passive radiators and the like.

While in accordance with the provisions of the Patent Statutes, the preferred forms and embodiments have been illustrated and described, it will become apparent to those skilled in the art that various changes and modifications may be made without deviating from the inventive concepts set forth above.

I claim:

1. In a horn type loudspeaker for operation in a low frequency range, a cabinet comprising a rear panel, an inner panel spaced forwardly of said rear panel and having a vertically oriented throat opening therein, two inner side panels engaged with the outside edges of said inner panel, converging forwardly of said inner panel to engage at each side of a frontally arranged panel, said front panel being more narrow than said inner panel, forming a substantially trapezoidal columnar air chamber therewith, a phase inverting means of said air chamber arranged in said front panel, two outer side panels engaged with the outside edges of said rear panel, spaced from said inner side panels in oppositely disposed spaced planes to form the horizontally flaring portions of the terminal horn sections therewith, baffles cooperating with said throat opening and said rear panel to create an equal division of the air column rearward of said throat opening, forming two horizontal horn sections flaring vertically in opposite directions from said throat opening to said terminal horn sections, side channel baffles arranged to flare vertically from the terminal height of said horizontal sections in cooperation with said horizontally flaring terminal sections to the height of said air chamber partially completing said terminal horn sections, means for completing said terminal horn sections and said air chamber, and an apertured panel for enabling the sealed engagement of at least one driving unit, mounted forwardly of said throat opening and cooperating therewith, to transmit sound though said throat opening and said horn sections therebeyond.

2. In a horn type loudspeaker as set forth in claim 1, wherein said air chamber being arranged to enclose a volume of air sufficient to resonate said driving unit below the low frequency cutoff of said horn sections.

3. In a horn type loudspeaker as set forth in claim 1, wherein said completing means includes a top panel in engagement with the ends of said rear and inner and outer panels forming a closure for said air chamber and said terminal horn sections.

4. In a horn type loudspeaker as set forth in claim 3, wherein said top panel is apertured to provide vertical access to the internal volume of said air chamber and said throat opening therein.

5. In a horn type loudspeaker as set forth in claim 1, wherein said completing means further includes a bottom panel in engagement with the ends of said rear and inner and outer panels, forming a closure for said chamber and said terminal horn sections.

6. A folded bass horn enclosure comprising:

a vertically-oriented back chamber consisting of panels, arranged with the widest panel being rear-most, the narrowest panel being front-most, said rear-most panel having at least one throat opening therein, and said front-most panel having at least one phase-inverting apparatus therein, at least one driving unit arranged to operate in sealed relation with said each throat opening, an assembly of baffles, engaged with said rear-most panel of said back chamber, arranged in sealed engagement with said throat opening and further arranged to expand vertically from said throat opening toward each opposite side of said rear-most panel, forming two vertically flaring horizontal horn pathways, a back panel engaged in sealed relation with said assembly of baffles, a top and bottom panel engaged in sealed relation with said back and said back chamber, two side panels engaged in sealed relation with said back and top and bottom panels, forming the terminal horizontal flaring horn pathways, and side channel baffles engaged in sealed relation with said side panels and said back chamber sides and said assembly of baffles, arranged to expand vertically from said vertically flaring horizontal horn pathways to complete said terminal horizontal flaring horn pathways.

7. A folded bass horn enclosure as set forth in claim 6, wherein said back chamber cross-section is substantially trapezoid-shaped.

8. A folded bass horn enclosure as set forth in claim 6, wherein said throat opening is proportioned as a vertically-oriented rectangle centrally located on said rear-most panel.

9. A folded bass horn enclosure as set forth in claim 6, wherein said assembly of battles includes upper and lower baffles arranged horizontally to provide the maximum vertical expansion limit which is less than the height of said back chamber.

* * * * *